United States Patent
Seff et al.

(10) Patent No.: US 12,402,259 B2
(45) Date of Patent: Aug. 26, 2025

(54) PEDESTAL FOR A NUMBER OF ELECTRICAL CHARGING BOXES

(71) Applicant: EATON INTELLIGENT POWER LIMITED, Dublin (IE)

(72) Inventors: Paul D. Seff, Williamsburg, VA (US); Robert J. Reese, Edwardsville, IL (US); Jonathan R. Turman, Quinton, VA (US); Bryan A. Hain, Hudson, OH (US); Hyuk Jae Chang, Pittsburgh, PA (US); Michael Laskowski, Pittsburgh, PA (US); Stan Mamula, Jr., Oakmont, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 603 days.

(21) Appl. No.: 17/880,369

(22) Filed: Aug. 3, 2022

(65) Prior Publication Data
US 2024/0049407 A1 Feb. 8, 2024

(51) Int. Cl.
H05K 5/02 (2006.01)
B60L 53/14 (2019.01)
B60L 53/31 (2019.01)
H02G 3/04 (2006.01)

(52) U.S. Cl.
CPC ......... *H05K 5/0204* (2013.01); *H05K 5/0247* (2013.01)

(58) Field of Classification Search
CPC .... H05K 5/0204; H05K 5/0247; B60L 53/14; B60L 53/31; H02G 3/0493
See application file for complete search history.

(56) References Cited

U.S. PATENT DOCUMENTS

| | | | |
|---|---|---|---|
| 2013/0169227 A1* | 7/2013 | Tremblay | B60L 53/305 320/109 |
| 2020/0180457 A1* | 6/2020 | Waffner | B60L 53/31 |
| 2020/0227903 A1* | 7/2020 | Helnerus | H02G 3/16 |
| 2021/0107368 A1* | 4/2021 | Helnerus | B60L 53/11 |
| 2021/0237598 A1* | 8/2021 | Helnerus | H02J 7/0045 |
| 2021/0237599 A1* | 8/2021 | Müller-Winterberg | B60L 53/67 |
| 2021/0354578 A1* | 11/2021 | Kirschner | B60L 53/11 |
| 2022/0410753 A1* | 12/2022 | Brower | H02J 7/0047 |
| 2023/0056858 A1* | 2/2023 | Brower | B60L 53/31 |
| 2023/0057374 A1* | 2/2023 | Sohl | B60L 53/50 |
| 2023/0318331 A1* | 10/2023 | Cavanaugh | H02G 11/003 320/109 |

* cited by examiner

*Primary Examiner* — Timothy J Thompson
*Assistant Examiner* — Amol H Patel
(74) *Attorney, Agent, or Firm* — Eckert Seamans Cherin & Mellott, LLC

(57) ABSTRACT

A pedestal has two sides that are opposite one another and to which various charging boxes can be mounted and electrically connected. For instance, the pedestal can have the same charging boxes mounted to the two sides and electrically connected with a power system upon which the pedestal is positioned. Instead, two different charging boxes can be mounted to the two sides. Importantly, either or both charging boxes can be easily removed by appropriate personnel and alternatively replaced with other charging boxes if, for instance, the market for needing specific electrical charging has changed or if the population of electrical vehicles needing electrical charging has grown in a new direction, by way of example.

20 Claims, 15 Drawing Sheets

PEDESTAL FOR A NUMBER OF ELECTRICAL CHARGING BOXES

BACKGROUND

Field

The disclosed concept relates generally to pedestals situated on power systems and, more particularly, to such a pedestal to which versatile mounting of charging boxes thereto is available.

Background Information

Numerous types of systems are known for enabling the charging of mobile electrical devices, particularly electrical vehicles. A typical system includes a source of electrical power that is delivered at the end of a cable which can be connected to a vehicle. However, electrical vehicles are of various types and/or brands, and thus they do not all necessarily have thereon the same equipment that is used for receiving to the electrical devices the recharging electrical power. Since the electrical recharging market is currently in a state of flux and thus is experiencing growth of certain brands and is expected to experience new brands, the setups of current installations of systems for recharging particular electrical vehicles are envisioned to be undesirable because they are usable only by certain electrical vehicles. Improvements thus would be desirable.

SUMMARY

These needs and others are met by embodiments of the invention, which is directed to a pedestal to which is provided a versatile mounting of a number charging boxes that are available thereto. As employed herein, the expression "a number of" shall refer broadly to any non-zero quantity, including a quantity of one.

In one aspect of the disclosed invention, an improved pedestal is provided having two sides that are opposite one another and to which various charging boxes can be mounted and electrically connected. For instance, the pedestal can have the same charging boxes mounted to the two sides and electrically connected with a power system upon which the pedestal is positioned. Alternatively, two different charging boxes can be mounted to the two sides. Importantly, either or both charging boxes can be easily removed by appropriate personnel and replaced with other charging boxes if, for instance, the market for needing specific electrical charging has changed or if the population of electrical vehicles needing electrical charging has grown in a new direction, by way of example.

In another aspect of the disclosed invention, the pedestal is mounted to a support that typically is formed of concrete which is poured into place atop a power system that is situated underground. The pedestal has a base that is affixed to a support with a number of threaded fasteners. The base of the pedestal is advantageously configured so that all of the connections with a number of threaded fasteners and the threaded fasteners themselves which connect with the support are internal to the pedestal, which is desirable from both a visual aspect and from a way of avoiding undesirable access to such threaded fasteners.

As one aspect of the disclosed and claimed concept, an improved pedestal is structured to have mounted thereon and to connect a number of electrical service conductors to a number of charging boxes. The pedestal can be generally stated as including a body that can be generally stated as including a head having an interior that is structured to have situated therein a plurality of electrical service conductors, the head can be generally stated as including a case in which the interior is situated, the case having a side and further having an opening formed in the side, the case further having a plurality of first holes formed therein, the head further can be generally stated as including a plate having a plurality of second holes formed therein adjacent a perimeter of the plate, the plate being receivable over the opening, at least a subset of the plurality of second holes being aligned with at least a subset of the plurality of first holes when the plate is received over the opening, and the head having a plurality of additional holes formed in at least one of the plate and the case, at least a subset of the plurality of additional holes being structured to have mounted thereto at least a subset of the number of charging boxes, and at least another subset of the plurality of additional holes being structured to have mounted thereto at least another subset of the number of charging boxes when at least one of i) the at least subset of the number of charging boxes has been removed from the at least subset of the plurality of additional holes and the at least another subset of the number of charging boxes is alternatively received on at least a portion of the at least subset of the plurality of additional holes, and ii) the at least another subset of the plurality of additional holes additionally receive thereon the at least another subset of the number of charging boxes.

As another aspect of the disclosed and claimed concept, an improved method includes mounting onto a pedestal a number of charging boxes, the pedestal having a body having a head, the head having an interior having situated therein a number of electrical service conductors, the head further having a case in which the interior is situated, the case having a side and further having an opening formed in the side, the case further having a plurality of first holes formed therein, the head further having a plate having a plurality of second holes formed therein adjacent a perimeter of the plate, at least a subset of the plurality of second holes being aligned with at least a subset of the plurality of first holes when the plate is received over the opening, the head having a plurality of additional holes formed in at least one of the plate and the case. The method can be generally stated as including mounting at least a subset of the number of charging boxes to at least a subset of the plurality of additional holes, receiving the plate over the opening, mounting at least another subset of the number of charging boxes to at least another subset of the plurality of additional holes by at least one of: ii) removing the at least subset of the number of charging boxes from the at least subset of the plurality of additional holes and alternatively receiving the at least another subset of the number of charging boxes on at least a portion of the at least subset of the plurality of additional holes, and ii) additionally receiving the at least another subset of the number of charging boxes on at least another subset of the plurality of additional holes.

While it is noted that the mounting of the at least subset of the number of charging boxes occurs to at least a subset of the plurality of additional holes, and the alternative receiving of the at least another subset of the number of charging boxes occurs on at least a portion of the at least subset of the plurality of additional holes, it is noted that all of the additional holes can be used in the installation of both charging boxes without departing from the inventive concepts presented herein.

BRIEF DESCRIPTION OF THE DRAWINGS

A full understanding of the disclosed concept can be gained from the following Description when read in conjunction with the accompanying drawings in which.

Similar numerals refer to similar parts throughout the specification.

DESCRIPTION OF THE PREFERRED EMBODIMENTS

Figure 1:
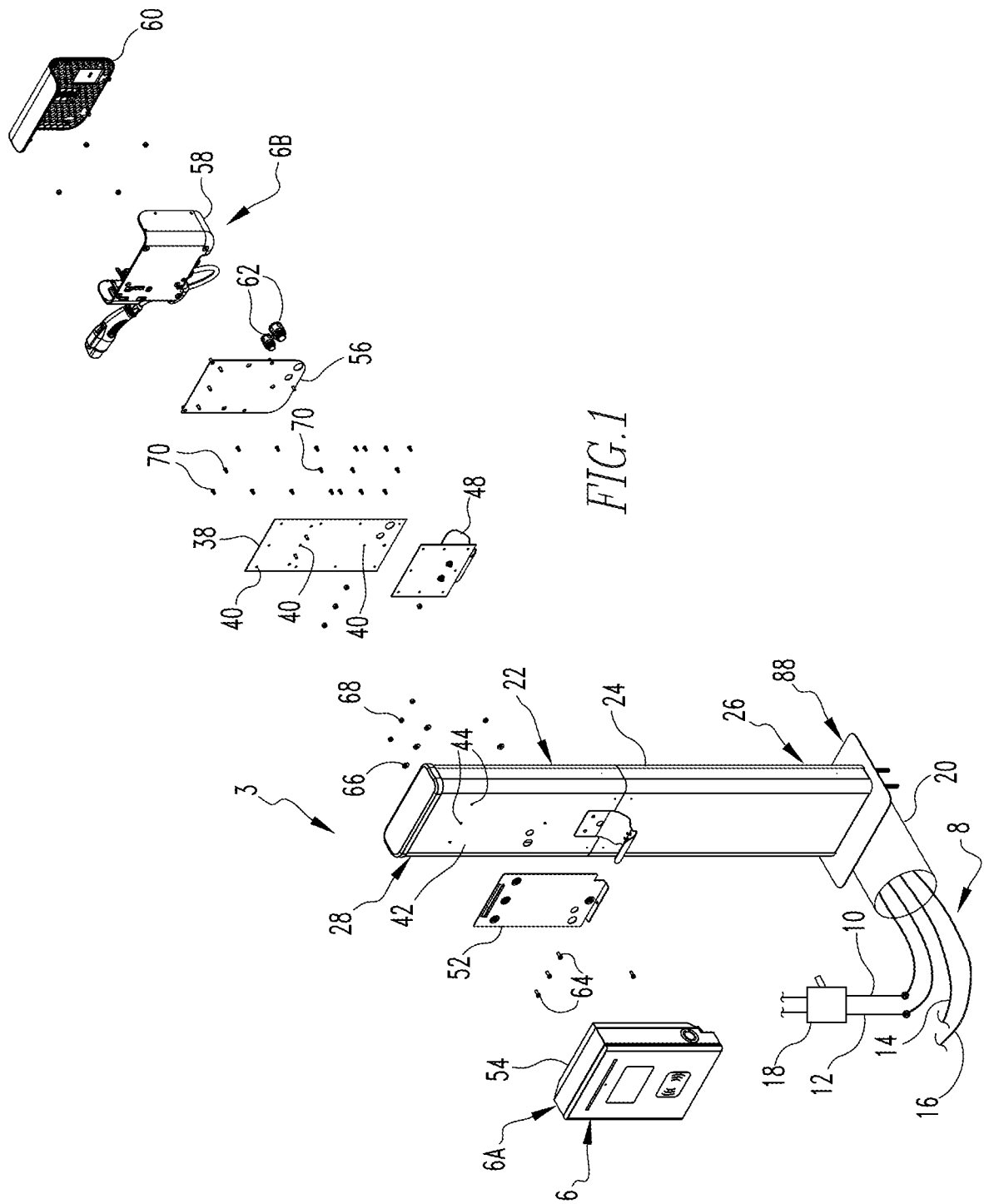
FIG. 1 is a perspective exploded view of an improved pedestal partially disassembled and with two different charging boxes exploded away from the pedestal and prior to their installation thereon.

An improved pedestal 3 in accordance with the disclosed and claimed concept is depicted generally in FIGS. 1-3 and 6-8, and portions of it are depicted in FIGS. 3-5 and 9-15. The pedestal 3 is usable to have installed thereon one or more of, i.e., a number of, charging boxes of which a plurality exist that are different from one another and are shown in FIGS. 1-3 and 6-7 at the numerals 6A and 6B, it being understood that another charging box 6C is shown in FIGS. 8A and 8C as being installed on the pedestal 3 in place of either of charging boxes 6A and 6B. It is also understood that the charging boxes can be collectively or individually referred to with the numeral 6.

It is understood that the pedestal 3 has therein a set of electrical service conductors 8 that include a first electrical line 10, a second electrical line 12, a ground conductor 14, and a neutral conductor 16. At least the first and second electrical lines 10 and 12 are electrically connected with a circuit breaker 18 that is remote from the pedestal 3 and that is operable to switch off the electrical power being delivered to the pedestal 3 when it is desired to install the charging boxes 6 or to replace one of the charging boxes 6 with another charging box 6. The set of electrical conductors 8 come from a power system 20 that is underground and that has an internal region within which the electrical service conductors 8 extend and are situated.

Figure 2:
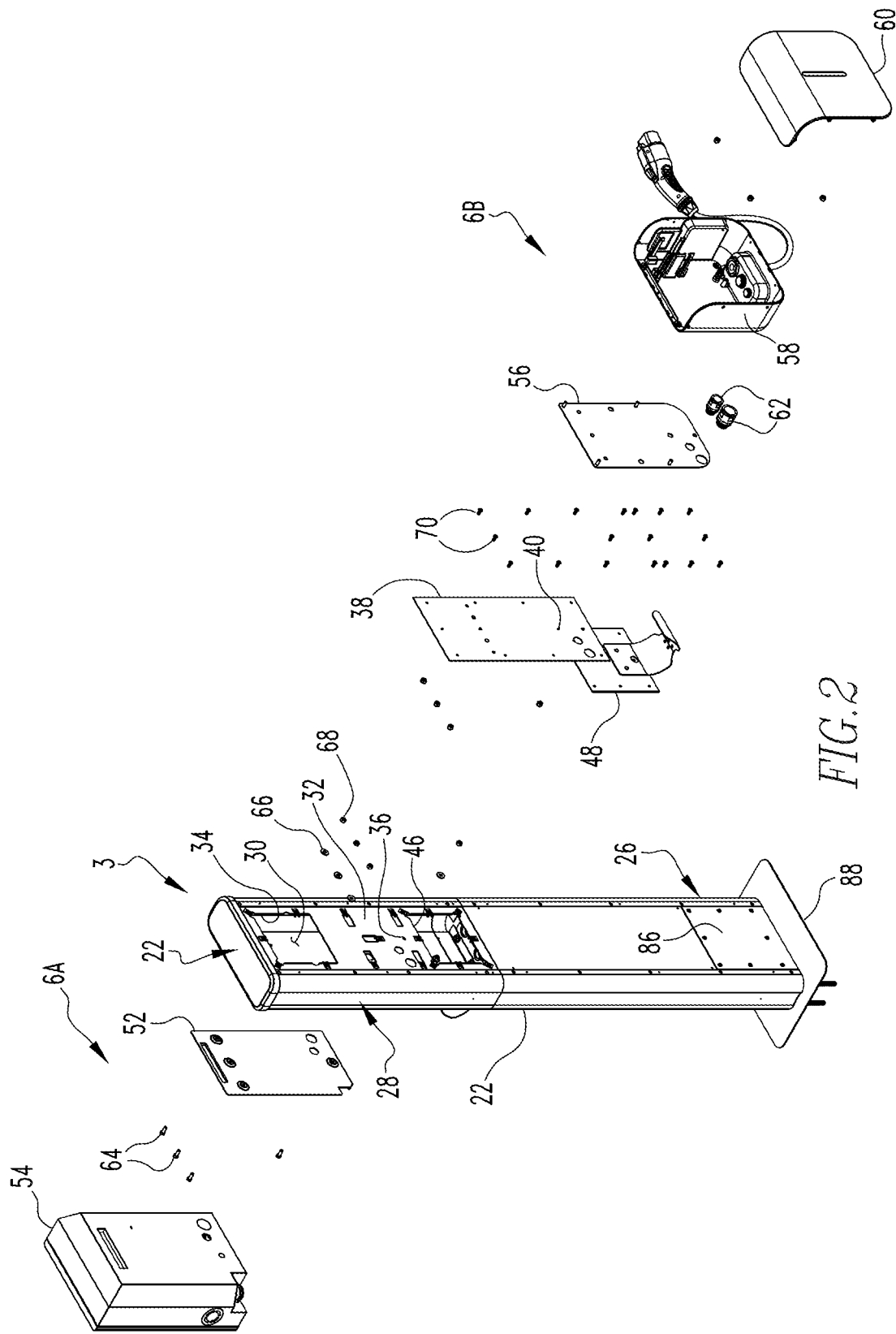
FIG. 2 is a view similar to FIG. 1, except depicting from an opposite side the partially disassembled view of the pedestal and the exploded-away pair of charging boxes.
Figure 9:
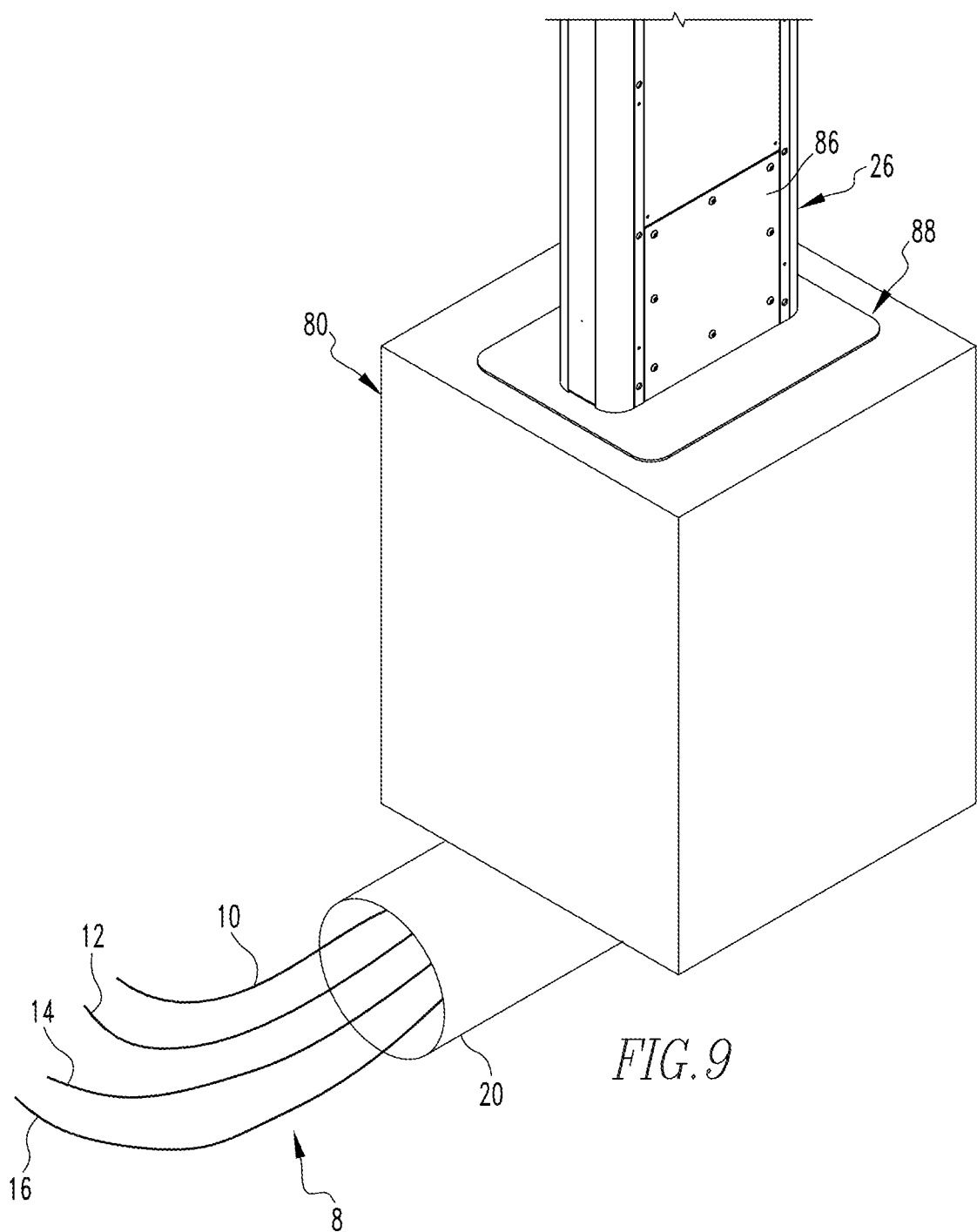
FIG. 9 is a perspective view depicting the base of the pedestal being mounted to a concrete support that is situated on the ground.

As can be understood from FIGS. 1 and 2, the pedestal 3 can be said to be elongated and to include a head 22 generally at the top, a post 24 being generally in the middle, and a base 26 being generally at the bottom and mountable to a support 80 as is shown in FIG. 9. It should be understood when the pedestal 3 is properly installed as described herein, the post 24 will extend upwardly from the base 26, and the head 22 is generally situated at the top of the post 24. As will be set forth in greater detail below, the base 26 is mounted onto a support device that is installed atop the power system and that provides access through it to provide electrical access between the electrical service conductors 8 that are within the pedestal 3 and the power system 20.

The head 22 can be said to include a case 28 having an interior 30, it being understood that the electrical service conductors 8 extend through the interior 30. As can be understood from FIG. 2, the case 28 has a side 32 within which an upper opening 34 is formed. Moreover, the side 32 has a number of first holes 36 formed therein. Many if not all of these number of first holes 36 are depicted as being situated generally adjacent the upper opening 34, although this need not necessarily be the case. Furthermore, the head 22 has a plate 38 that is installable onto the side 32 of the case 28 in order to cover underneath it the upper opening 34. In this regard, it can be seen that the plate 38 has a number of second holes 40 formed therein. Many of these second holes 40 are situated adjacent the perimeter of the plate 38, although this again need not necessarily be the case. It is also noted that many of the first holes 36 and second holes 40 are aligned with one another when the plate 38 is properly positioned on the side 32 overlying the upper opening 34, which facilitates fasteners to be used between at least certain of the first and second holes 36 and 40, depending upon their availability when mounting the desired charging box 6 onto the side 32.

As can be seen in FIG. 1, the head 22 has another side 42 that is opposite the side 32. The another side 42 has a number of additional holes 44 formed therein. The charging box 6A includes a bracket 52 and a charging cover 54, and the charging box 6A can be mounted to the another side 42 by receiving a number of bolts 64 through holes formed in the bracket 52 and through the additional holes 44 and, via access to the interior 30 via the upper opening 34, by receiving a number of washers 66 and a number of nuts 68 onto the exposed threaded shafts of the bolts 64 within the interior 30 of the case 28. As can be understood from FIGS.

7A and 7B, the charging box 6A additionally includes a charging cord 53 that extends from the charging cover 54 and, when unused, is stored on a cord hook 55 that is situated on the pedestal 4. The electrical service conductors 8 are electrically connected with the charging cover 54, and the charging cover 54 is mounted to the bracket 52. This results in an installed position of the charging box 6A, such as is depicted generally in FIG. 3.

Figure 3:
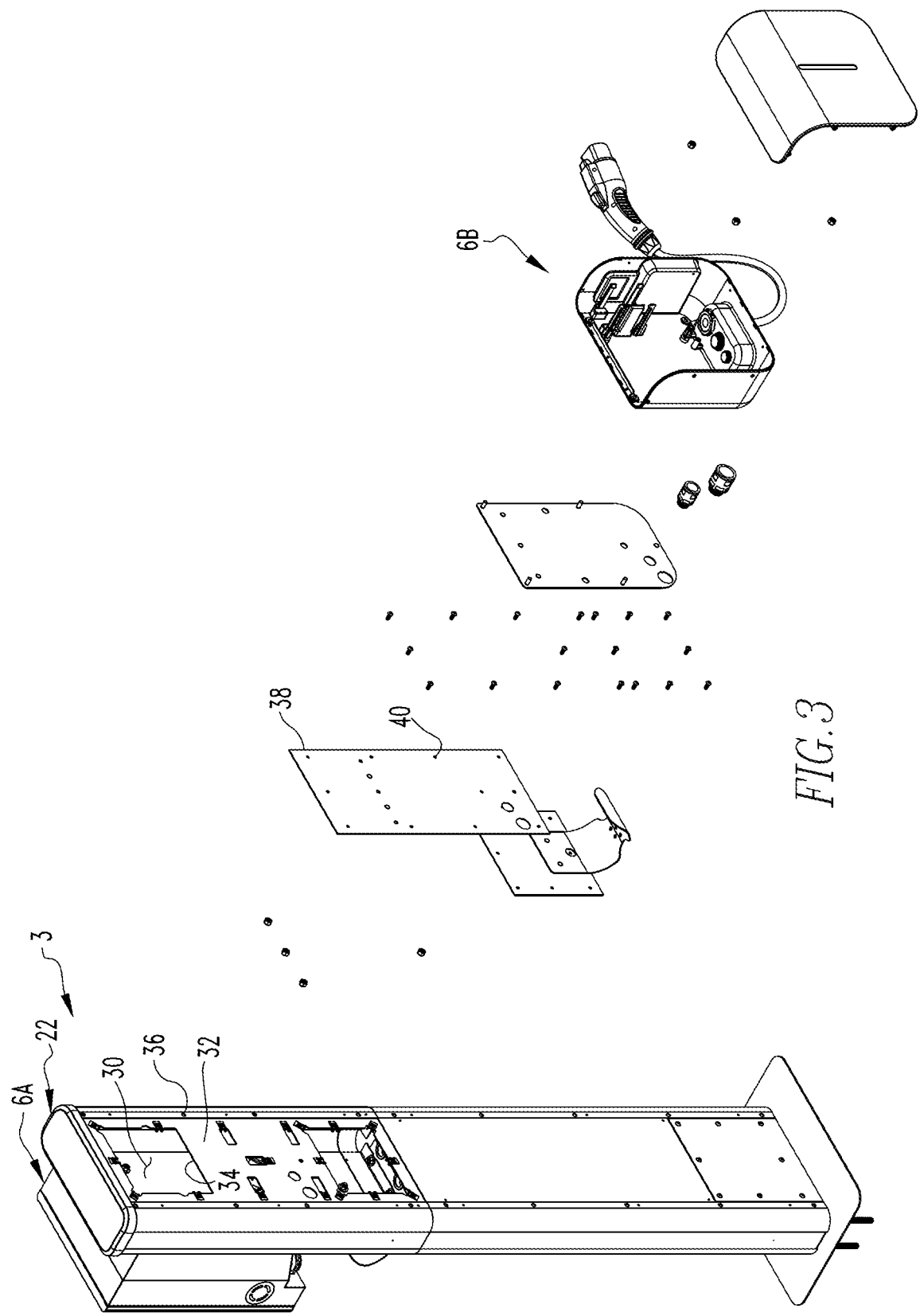
FIG. 3 is a view similar to FIG. 2, except depicting one of the charging boxes installed on the pedestal while the other charging box remains exploded away.
Figure 4:
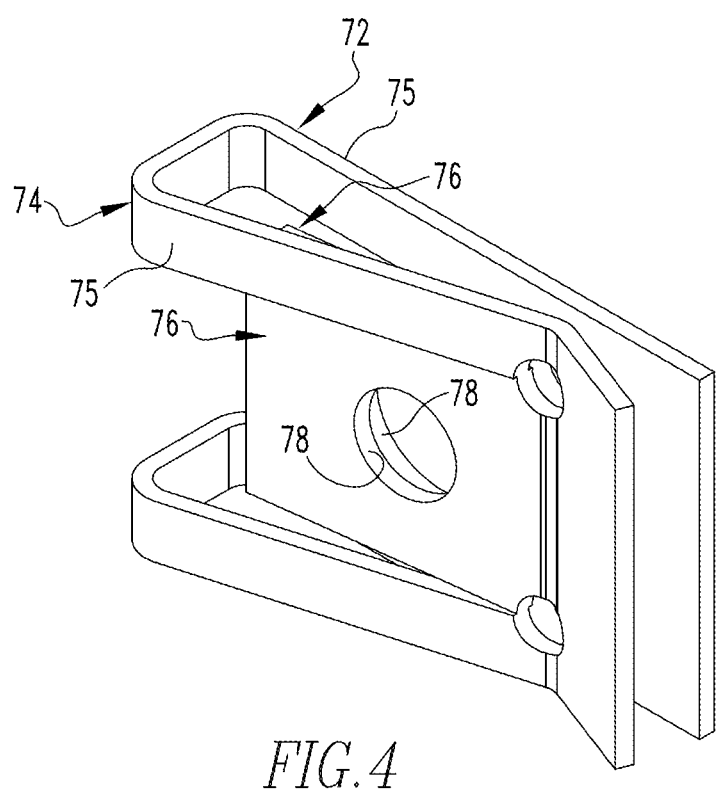
FIG. 4 is a view of a bolt receptacle that is mountable on the pedestal adjacent holes formed therein and that is thread-cooperable with threaded fasteners such as bolts that are used in assembling portions of the pedestal and for mounting the charging boxes onto the pedestal.
Figure 5:
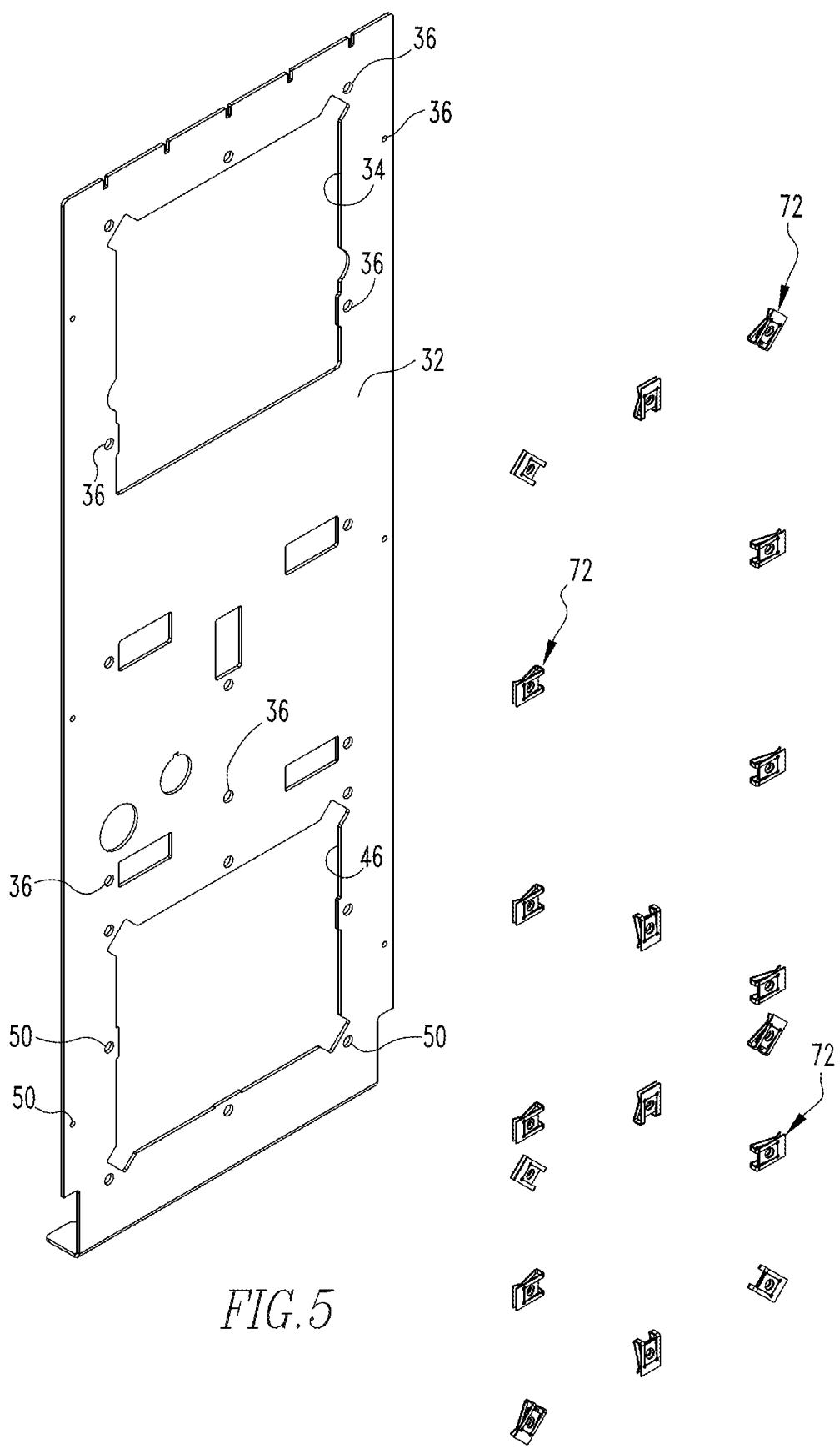
FIG. 5 is an enlarged view of a portion of a side of the pedestal that is shown in FIG. 2 and that has a plurality of the bolt receptacles of FIG. 4 depicted in a condition exploded away from the pedestal.

As can further be understood from FIGS. 3 and 5, the side 32 of the case 28 has a middle opening 46 formed therein, and the head 22 further includes an interior access cover 48 that is receivable over the middle opening 46. In this regard, the case 28 has a number of further holes 50 formed therein adjacent the middle opening 46, and the interior access cover 48 likewise has a number of holes formed therein that can be fastened together with fasteners such as a number of other bolts 70 received through the holes in the interior access cover 48 and the further holes 50, and then received in a number of bolt receptacles 72 such as are shown in FIGS. 4 and 5, and which are depicted in FIG. 5 as being exploded away from the middle opening 46.

In this regard, the bolt receptacles 72 that are shown in FIGS. 4 and 5 each have a clip 74 having a pair of legs 75, with each leg 75 of the clip 74 having a flange 76 situated thereon. Each flange 76 has a thread-cooperative hole 78 formed therein. In the depicted exemplary embodiment, each flange 76 is simply a piece of sheet metal having an unthreaded hole formed therein that are each threadably-cooperable with the threaded shaft of a number of bolts 70 that are rotatably received therein. The bolt receptacle 72 is thus functionable as a threaded nut, for instance, that may be used for mounting the interior access cover 48 and the plate 38 to the side 32. In the depicted exemplary embodiment, the charging boxes 6 are mounted to the pedestal 3 using conventional nuts and the bolts 64, by way of example, rather than the bolt receptacles 72. In alternative embodiment, however, the threaded shaft of the other bolts 70 potentially can be used to fasten the charging boxes 6 to the pedestal 3 and potentially can be used for still other purposes as needed.

These other bolts 70 and these bolt receptacles 72 are usable to mount the plate 38 over the upper opening 34 by mounting the bolt receptacles 72 onto the case 28 as needed with the flanges 76 physically being positioned to surround the first holes 36 and by receiving a number of the other bolts 70 through at least some of the second holes 40 in the plate 38 and through the first holes 36 in the side 32 and thus likewise through the thread-cooperative holes 78 in the bolt receptacles 72. This secures the plate 38 onto the side 32 to overlie and cover the upper opening 34. This is the result that is depicted generally in FIG. 6.

Figure 6:
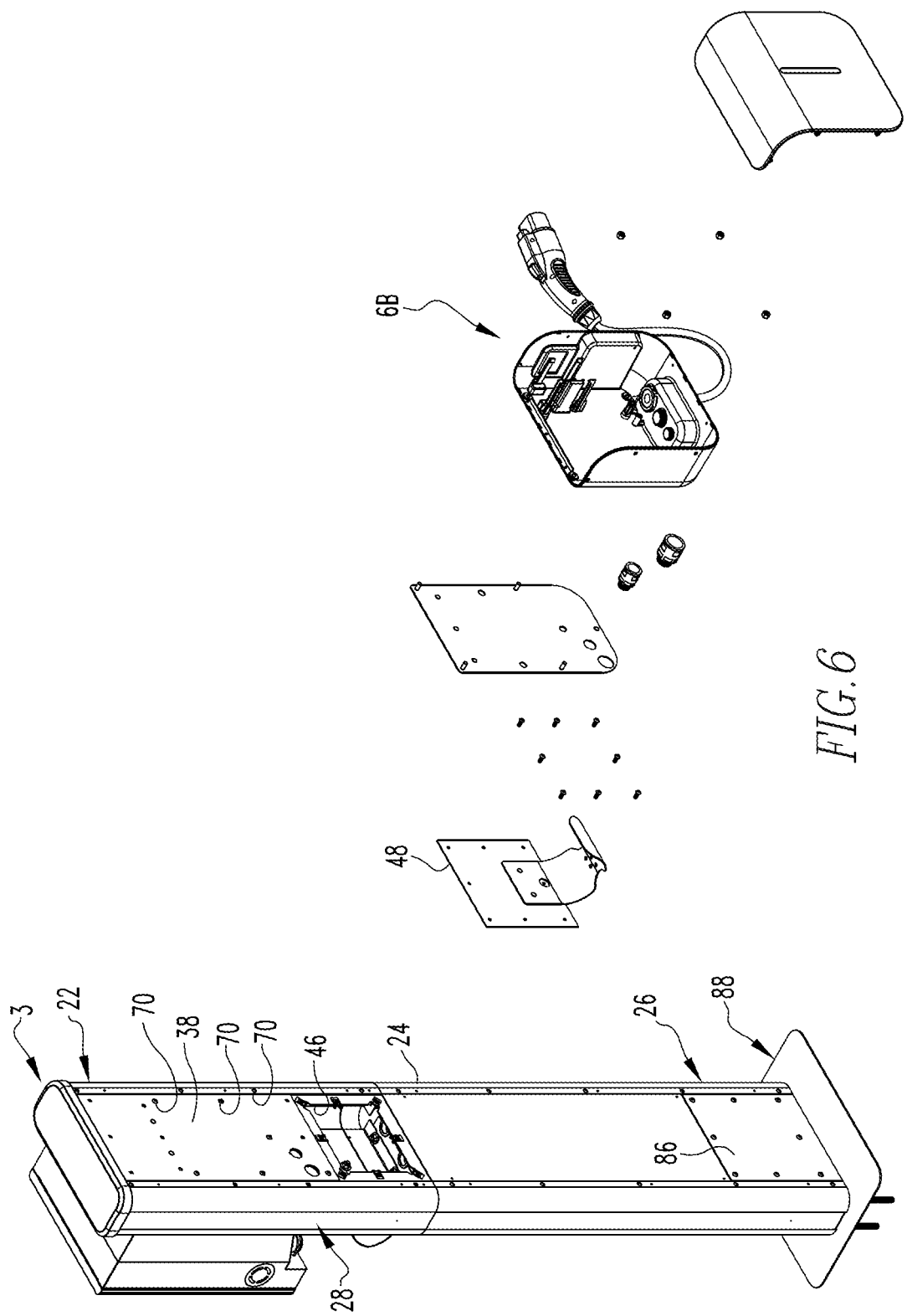
FIG. 6 is a view similar to FIG. 3, except depicting a plate of the pedestal installed over an upper opening of the pedestal while the other charging box remains exploded away.
Figure 7A:
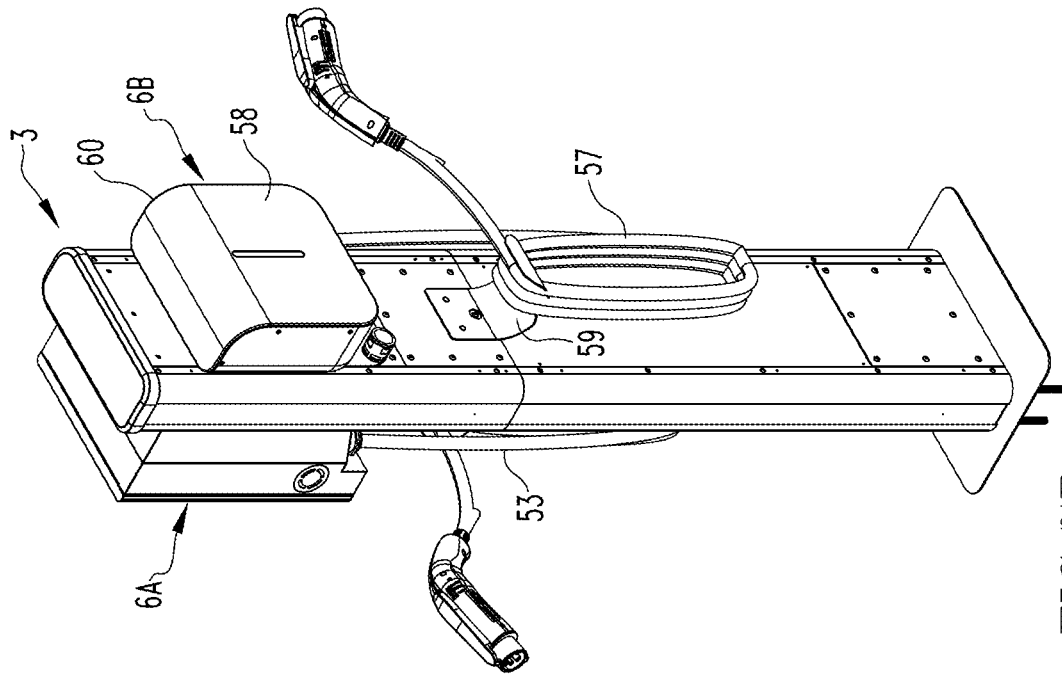
FIG. 7A is a perspective view from a different angle showing the pedestal having both charging boxes installed thereon.
Figure 7B:
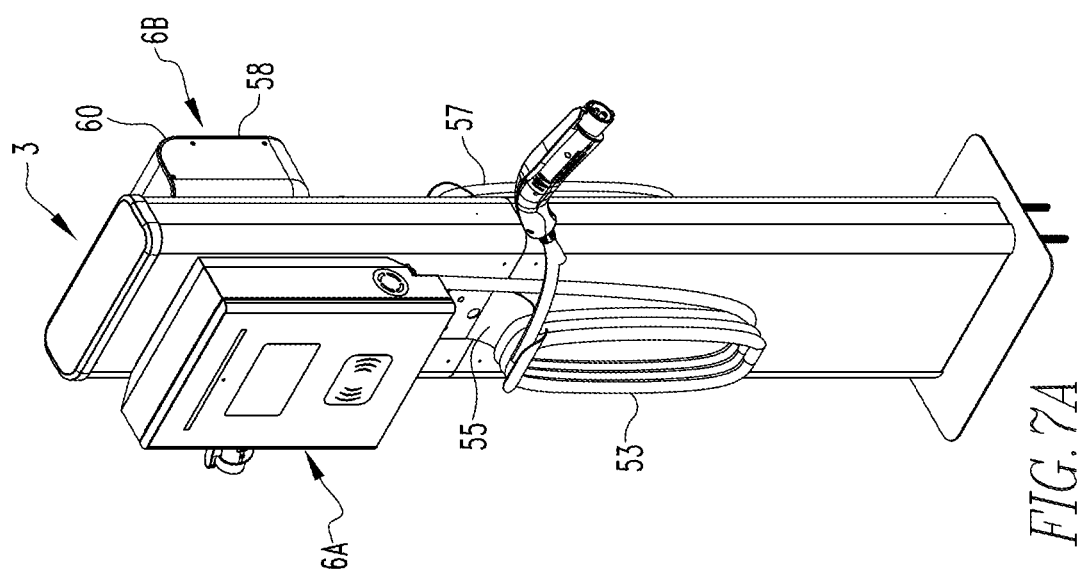
FIG. 7B is another perspective view from another different angle showing the pedestal having both charging boxes installed thereon.

As can further be understood from FIG. 6, the charging box 6B includes a bracket 56 that is mounted to the plate 38, a charger case 58 that is mounted to the bracket 56, and a charger cover 60 that is mounted to the charger case 58. In this regard, additional other bolts 70 are used to mount the bracket 56 to the plate 38 and possibly also to the case 28 by receiving them through appropriate holes formed in the bracket 56, through other second holes 40 formed in the plate 38, and through certain of the thread-cooperable holes of bolt receptacles 72 that were already received on the side 32 and positioned to be overlying certain of the first holes 36. As such, certain of the second holes 40 are used solely for mounting the plate 38 to the case 28 whereas other second holes are used for mounting the bracket 56 to the plate and to the case. In the depicted exemplary, the embodiment bracket 52 of the charging box 6A includes a total of four holes split up as three holes along the upper edge and one hole at the center of the bottom edge, and these four holes cooperate with the bolts 64 that cooperate with the additional holes 42 to mount the bracket 52 and the charging box 6A to the pedestal 3. It is understood, however, that variations on possible uses of the various holes and various bolts and threadable receptacles is available and is within the scope of the instant disclosure. Moreover, the various second holes 40 can be used in either or any such fashion vary depending upon the particular charging box 6 that is being installed and the need of that particular charging box 6 for the use of various mounting holes and threaded fasteners.

It is noted that installing of at least the charging box 6B additionally employs the use of a pair of conduit fittings 62 which, in the depicted exemplary embodiment, are of different sizes, and that receive therethrough certain of the electrical service conductors 8 that extend between the interior 30 of the pedestal 3 and electrically connect with the charger case 58. Once this is accomplished and the charger cover 60 is installed on the charger case 58, the charging base 6B has been completely installed onto the pedestal 3, as is depicted generally in FIGS. 7A and 7B. As can further be understood from FIGS. 7A and 7B, the charging box 6B additionally includes a charging cord 57 that extends from the charging case 58 and, when unused, is stored on a cord hook 59 that is situated on the pedestal 4.

Figure 8A:
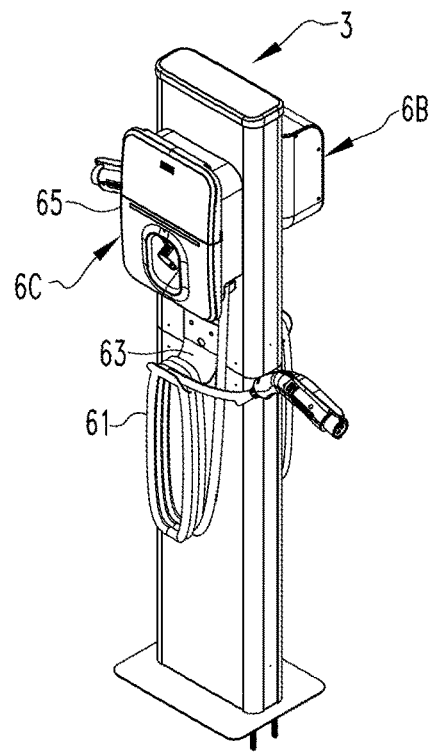
FIGS. 8A-8D are perspective views similar to the assembled pedestal and pair of charging boxes of FIG. 7, except each having a pair of charging boxes that are at least slightly different than the pair shown in FIG. 7.
Figure 8B:
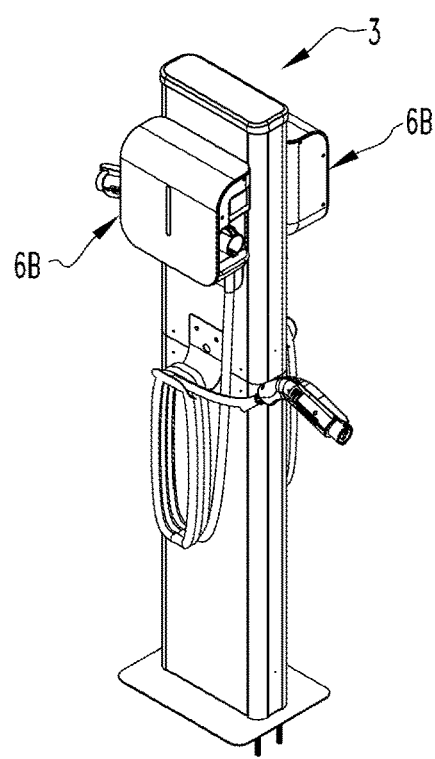
Figure 8C:
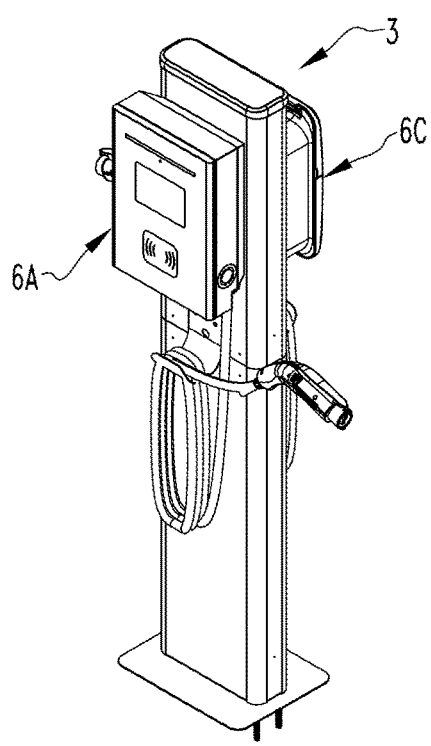
Figure 8D:
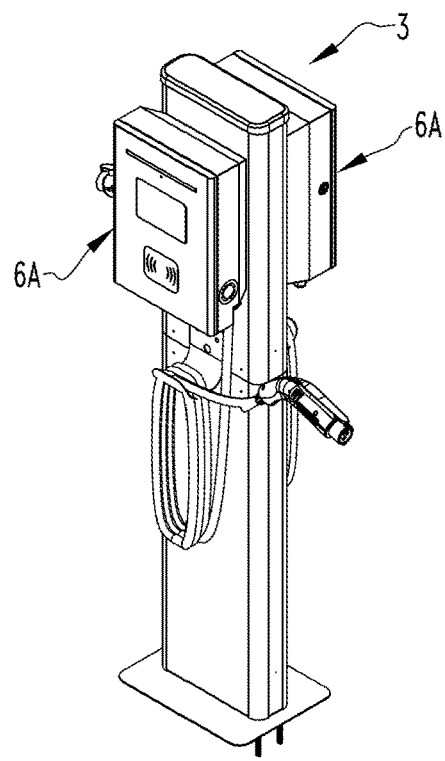

In this regard, it is noted that other complete installations of the charging boxes 6 onto the pedestal 3 are depicted generally in FIGS. 8A through 8D. In particular, FIG. 8A shows the charging box 6A having been removed and replaced with the aforementioned alternative charging box 6C. As can be understood from FIG. 8A, the charging box 6C additionally includes a charging cord 61 that extends from the charging cover 54 and, when unused, is stored on a cord hook 63 that is situated on the pedestal 4. FIG. 8B instead shows the charging box 6A having been alternatively replaced with another copy of the charging box 6B. FIG. 8C shows the charging box 6B having been alternatively replaced with the charging box 6C, and FIG. 8D shows the charging box 6B having been alternatively replaced with another copy of the charging box 6A. Any variations are possible.

It is reiterated that the mounting of the at least subset of the number of charging boxes 6 in the depicted example occurs to at least a subset of the plurality of additional holes 44, and the alternative receiving of the at least another subset of the number of charging boxes 6 occurs on at least a portion of the at least subset of the plurality of additional holes, and that all of the additional holes can be used in the installation of both charging boxes without departing from the inventive concepts presented herein. In this regard, it is to be understood that the forming of numerous of the first holes 36, second holes 40, further holes 50, and the like in the head 22, and the provision of the versatile and replaceable bolt receptacles 72 and other threaded bolt receptacles such as nuts, advantageously provide versatile available and possible attachment of the charging boxes 6 and of other charging boxes that are not necessarily shown herein onto the pedestal 3 with minimal effort. In installing one of the charging boxes 6 onto the pedestal 3, it typically will involve the use of at least a subset of the overall aforementioned numbers of holes that are formed therein to actually mount the charging box onto the pedestal 3. The holes that are not used to actually mount the charging box 6 onto the pedestal 3 will nevertheless be filled with bolts that are fastened with bolt receptacles 72 or other thread cooperative structures that simply enable the bolts to fill the hole that is not meaningfully being used to mount the charging box 6. Or, the hole and the bolt receptacle could be used to fasten, for instance, the plate 38 onto the upper opening 34.

However, when an initial charging box 6 is replaced with a subsequent charging box 6, such changing of the initial charging box 6 may or may not result in certain of the aforementioned holes that were used or unused in the mounting of the initial charging box 6 changing when the subsequent charging box 6 is installed. For instance, some of the holes being used to mount the new charging box 6 might be holes that were also used to mount the previous charging box 6, whereas other such holes are no longer being used for the new charging box 6. The versatility resulting from the vast number of holes that are provided thus improves the versatility of mounting various charging boxes 6 to the pedestal 3. Still as a variation, many or all of the holes might be used with all varying installations of the charging boxes 6, such as which is described herein, with the large number of holes potentially providing variety that is not used in all installations. Other variations will be apparent.

As can be seen in FIG. 9, the base 26 of the pedestal 3 is affixed to a support 80 which, in the example provided herein, is formed from concrete, although other types of support materials can be employed. As can be understood from FIG. 10, the support 80 has situated therein a plurality of tubes 82A, 82B, and 82C, which may be collectively or individually referred to herein with the numeral 82. In the depicted exemplary embodiment, it can be seen that the first electrical line 10 extends through the tube 82A, the second electrical line 12 extends through the tube 82B, and the ground conductor 14 and the neutral conductor 16 both extend through the tube 82C, although other arrangements are possible.

Figure 10:
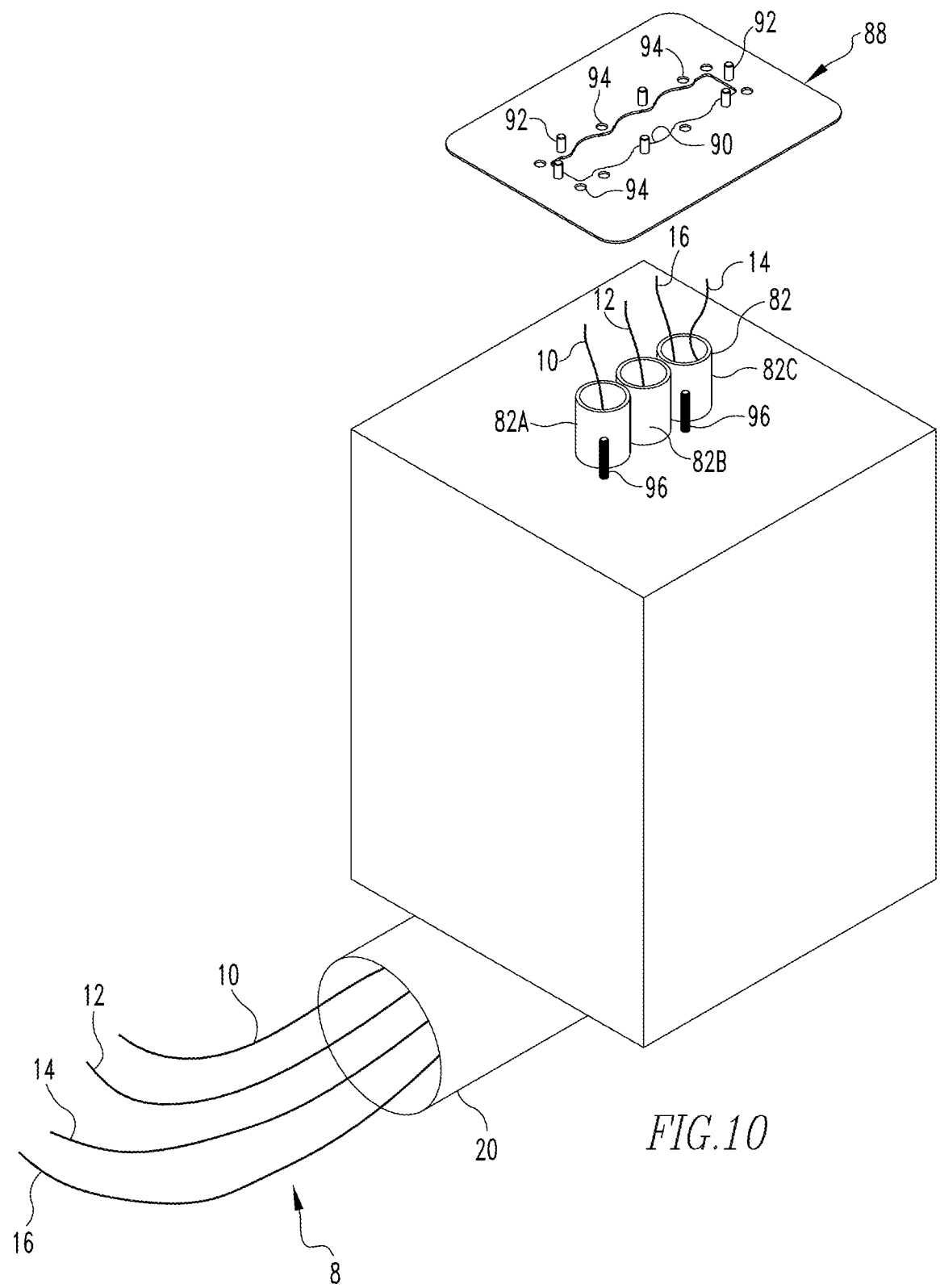
FIG. 10 is taken from a view similar to that of FIG. 9, but depicting the support and a base plate of the pedestal prior to completion of installation of the pedestal onto the support.

As can be understood from FIG. 10, the base 26 includes a lower portion of the pedestal 3, which is effectively an extension portion of the post 24, and a base plate 88. The base plate 88 has formed therein an open region 90 that is closely shaped to arrangement of the tubes 82 and thus receives the tubes 82 therein when the base plate 88 is received on an upper surface of the support 80. As can be understood from FIG. 15, and as will be set forth in greater detail below, the base 26 has a lower opening 84 formed therein which allows access to the base plate 88 when received on and installed onto the support 80, and the base 26 further has a base access cover 86 that is installable onto the lower opening 84. Specifically, the bolt receptacle 72 is functionable as a threaded nut, for instance, that may be used for mounting the base access cover 86 to the base 26, by way of example.

Figure 11:
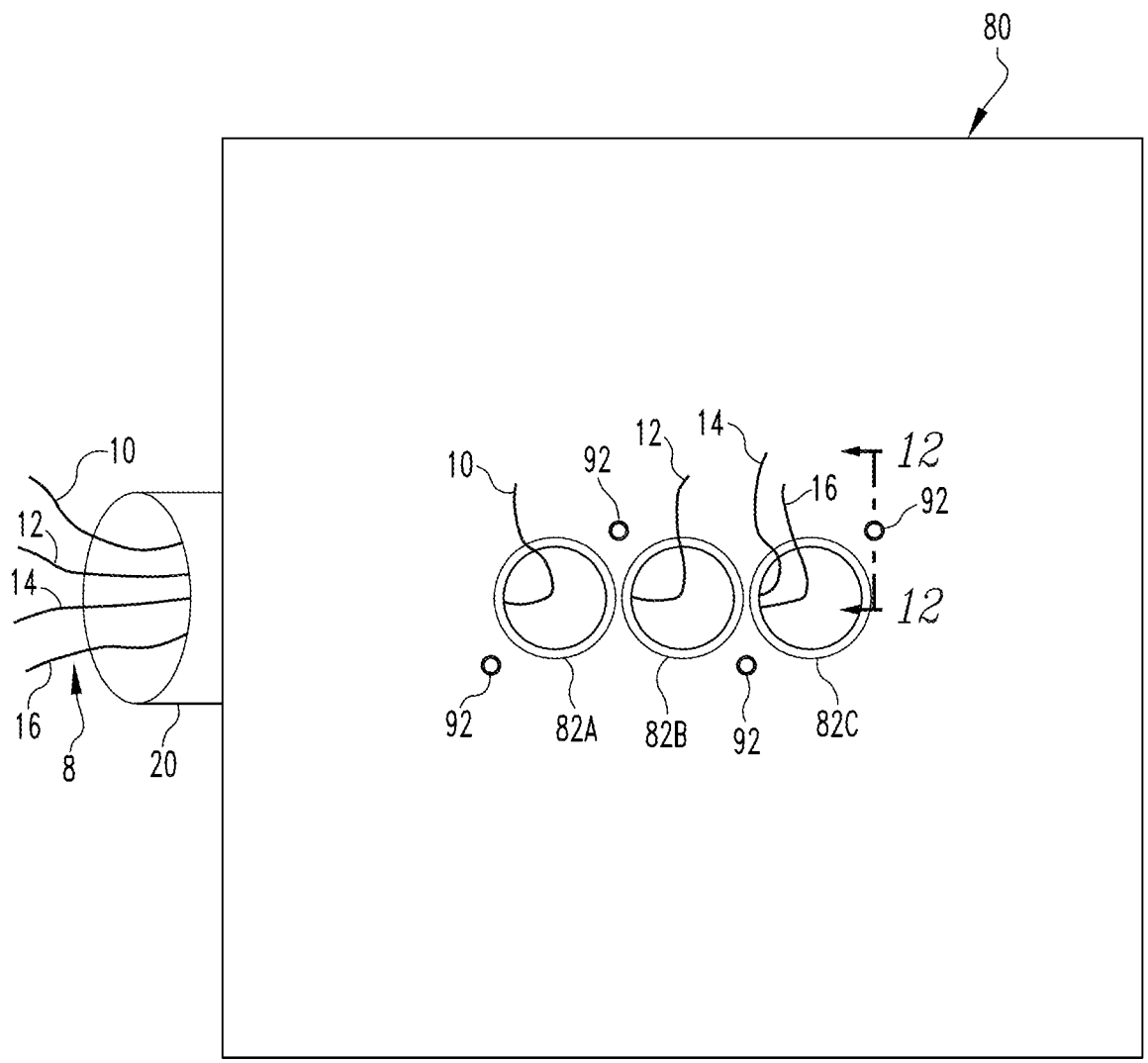
FIG. 11 is a top plan view of the support without the pedestal situated thereon.
Figure 12:
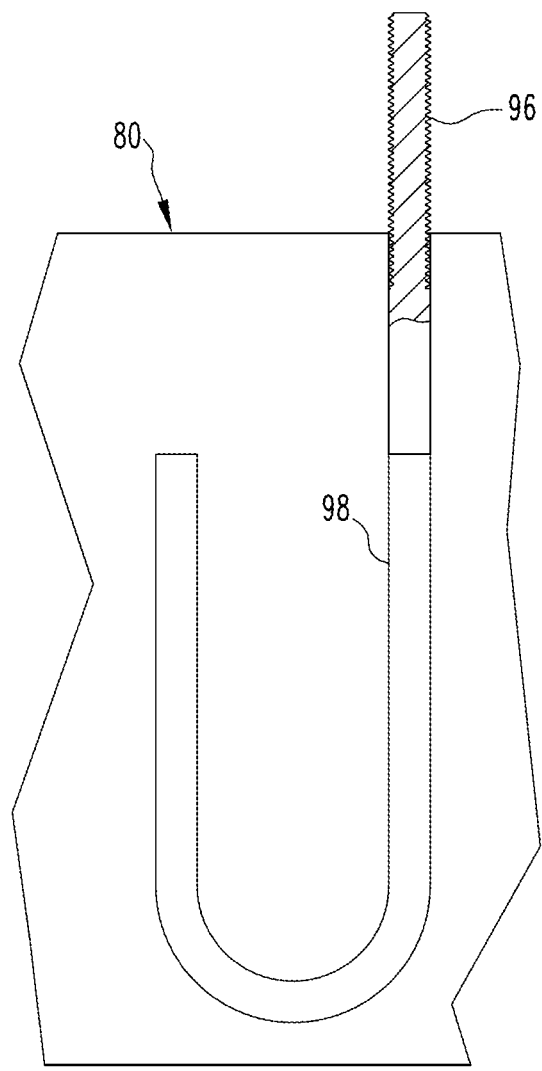
FIG. 12 is a sectional view as taken along line 12-12 of FIG. 11.
Figure 13:
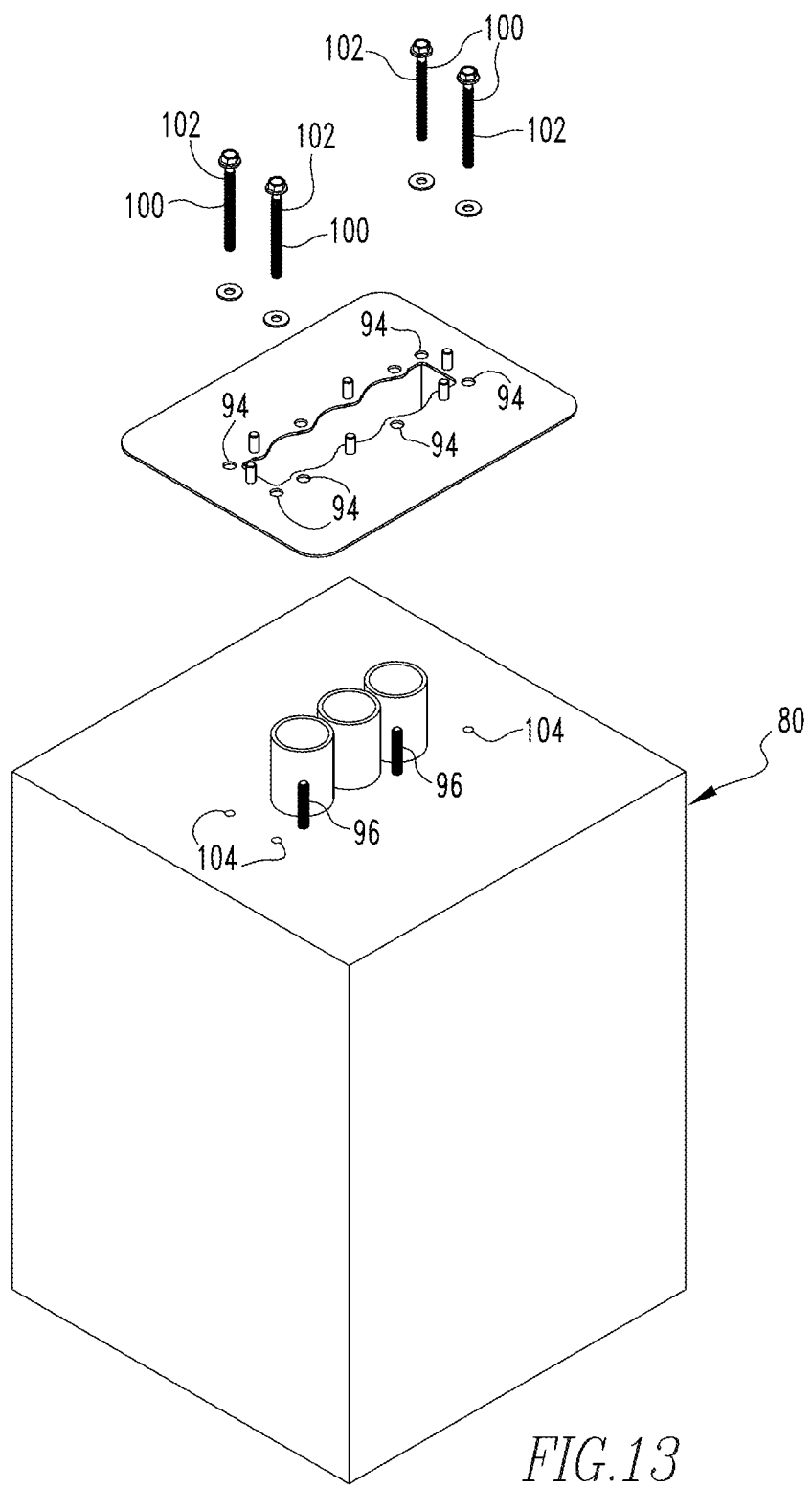
FIG. 13 is a view similar to FIG. 10, except depicting what amounts to an assembly step of mounting the pedestal base plate to the support.
Figure 14:
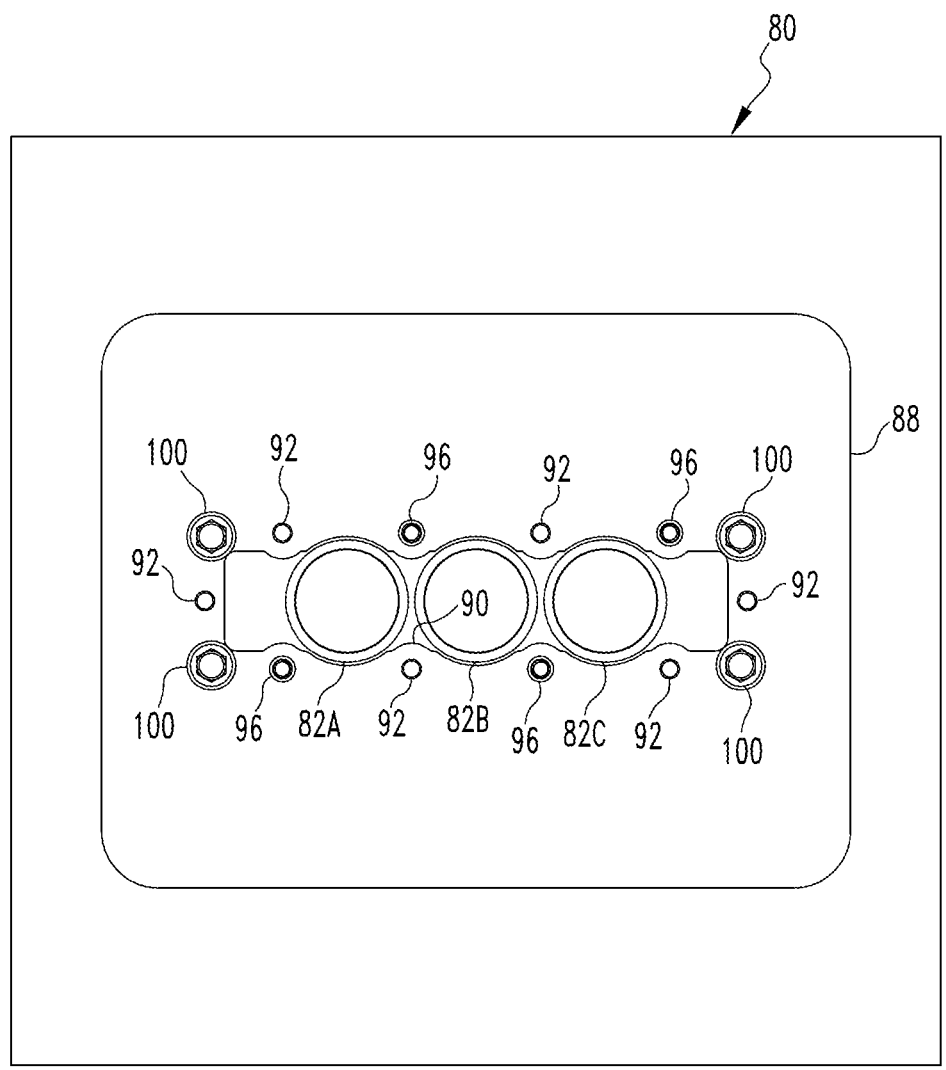
FIG. 14 is a top plan view of the support with the pedestal base plate installed thereon.

As can be understood from FIG. 10, the base plate 88 has a number of threaded shafts 92 fastened thereto such as by welding, a total of six of the threaded shafts 92 in the depicted exemplary embodiment, that are enabled to point upward and away from the support 80. The base plate 88 also has a number of base plate holes 94 formed therein. As can further be seen in FIG. 10, the support 80 itself additionally includes a number of upward threaded shafts 96 which, as shown in FIG. 12, each have a J-shaped bottom 98 that is received in the concrete of the support 80 and from which the upward threaded shafts 96 extend upward and into the air. While only two of the upward threaded shaft 96 are depicted in FIG. 10, it is understood that the support 80 includes a total of four of these upward threaded shafts 96, as are shown in FIG. 11. Also shown in FIG. 11 are the electrical service conductors 8 extending through the power system 20 and extending out of the tubes 82 as noted elsewhere herein.

In order to mount the base plate 88 to the support 80, the exemplary embodiment of the pedestal 3 employees a set of downward fasteners 100 in the form of bolts each having a threaded bolt shaft 102. In this regard, it is understood that the self-threading bolt shafts 102 are received in a set of receptacles 104 that are formed into the support 80, such as by drilling holes into the support 80 and receiving the receptacles 104 into the holes, which forms threads. In this regard, the downward fasteners 100 having threaded bolt shafts 102 that are received in the receptacles 104 and form threads therein could be replaced with fasteners similar to the upward threaded shafts 96 each having the J-shaped bottom 98, and vice-versa.

Figure 15:
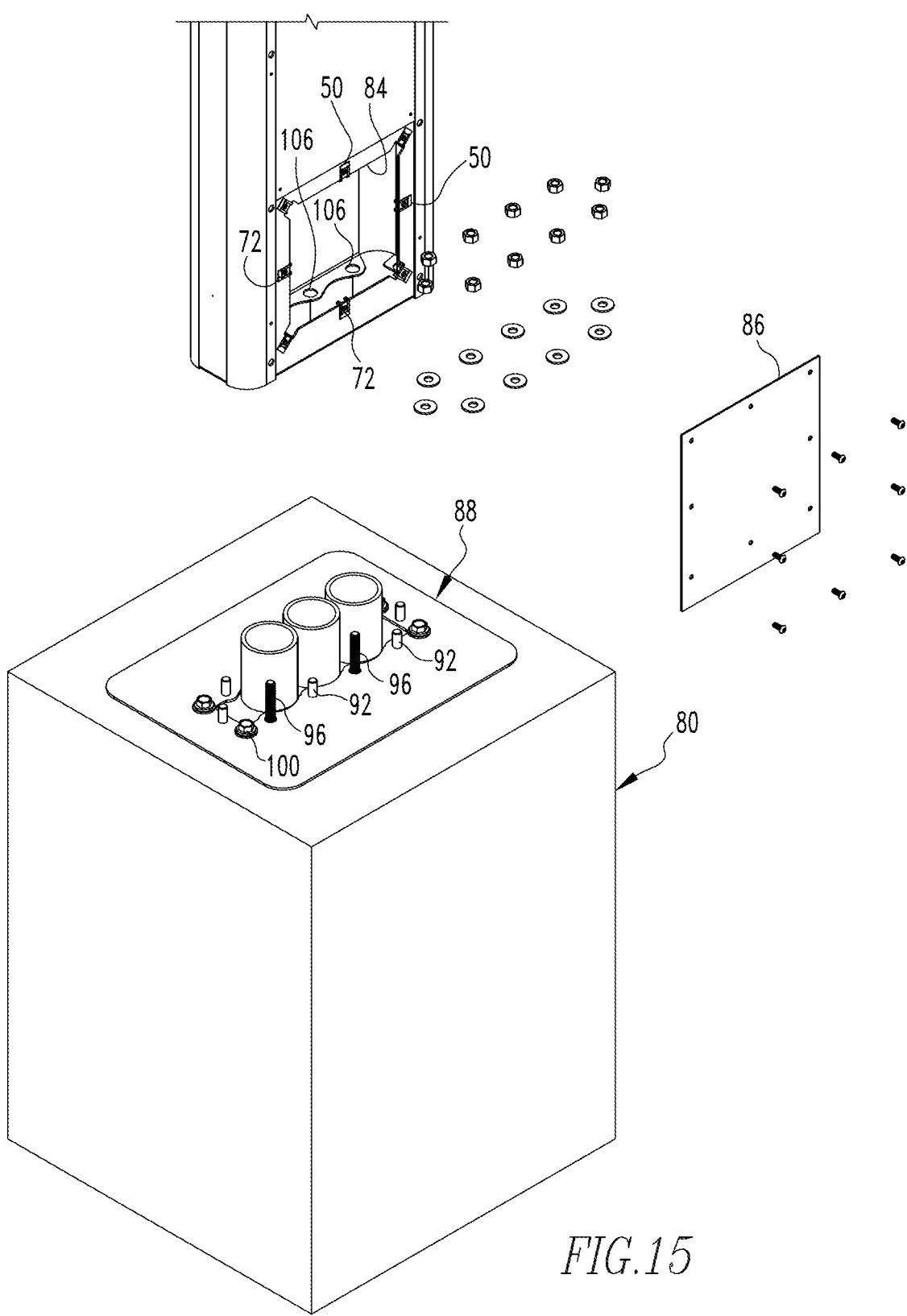
FIG. 15 is a view similar to the image of FIG. 13, except depicting the base of the pedestal being installed onto the pedestal base plate and onto the support and installing a base access cover over a lower opening in the pedestal.

The mounting of the base plate 88 onto the support 80 using the downward fasteners 100 and the receptacles 104 is shown generally in FIG. 15. As can further be understood from FIG. 15, the base 26 of the pedestal 3 has a number of pedestal base holes 106 that receive therein the threaded shafts 92 of the base plate 88 as well as the upward threaded shafts 96 of the support 80 that are attached to the base 26 of the pedestal 3 with appropriate washers and nuts.

It is additionally noted that the base 26 has additional further holes 50 formed therein adjacent the lower opening 84, and bolt receptacles 72 are received onto the base 26 overlying such holes. It then can be seen that additional other bolts 70 are received through holes that are formed adjacent the perimeter of the base access cover 86 and cooperate with the mount the base access cover 86 over the lower opening 84, and such installation covers up the interior attachment structures that are used mount the base 26 onto the support 80, as is shown in FIG. 9.

In forming the attachment of the base 26 to the support 80, it is noted that the various attachment structures provide various secure attachments of the pedestal 3 onto the support 80. In particular, the downward fasteners 100 fastened the base plate 88 to the support 80, and the threaded shafts 92 of the base plate 94 fastened the pedestal 3 to the base plate 94 and thus to the support 80. Moreover, the upward threaded shafts 96 extend from the concrete of the support 80 and connected directly with the pedestal 3, and thus provide an additional physical connection of the pedestal 3 directly with the support 80. This provides an additional connection between the pedestal 3 and the support 80 that does not rely upon the base plate 88 as an intermediate element. By covering up all of this by receiving the base access cover 86 over the lower opening 84, the result is visually advantageous and resists access to the lower opening 84 and any of the fastening structures that are contained therein. Other advantages will be apparent.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A pedestal structured to have mounted thereon and to connect a number of electrical service conductors to a number of charging boxes, the pedestal comprising:
    a body comprising a head having an interior that is structured to have situated therein a plurality of electrical service conductors;
    the head comprising a case in which the interior is situated, the case having a side and further having an opening formed in the side, the case further having a plurality of first holes formed therein;

the head further comprising a plate having a plurality of second holes formed therein adjacent a perimeter of the plate, the plate being receivable over the opening, at least a subset of the plurality of second holes being aligned with at least a subset of the plurality of first holes when the plate is received over the opening; and the head having a plurality of additional holes formed in at least one of the plate and the case, at least a subset of the plurality of additional holes being structured to have mounted thereto at least a subset of the number of charging boxes, and at least another subset of the plurality of additional holes being structured to have mounted thereto at least another subset of the number of charging boxes when at least one of:

the at least subset of the number of charging boxes has been removed from the at least subset of the plurality of additional holes and the at least another subset of the number of charging boxes is alternatively received on at least a portion of the at least subset of the plurality of additional holes, and the at least another subset of the plurality of additional holes additionally receive thereon the at least another subset of the number of charging boxes.

2. The pedestal of claim 1 wherein at least a portion of the plurality of additional holes are formed in the plate.

3. The pedestal of claim 1 wherein the case comprises another side having formed therein at least a portion of the plurality of additional holes.

4. The pedestal of claim 1 wherein a portion of the plurality of additional holes are formed in the plate, and wherein the case comprises another side having formed therein another portion of the plurality of additional holes.

5. The pedestal of claim 4 wherein the side and the another side are situated on a pair of opposite surfaces of the case.

6. The pedestal of claim 4 wherein the portion of the plurality of additional holes that are formed in the plate include both the at least subset of the plurality of additional holes structured to receive on the plate the at least subset of the number of charging boxes as well as the at least another subset of the plurality of additional holes structured to alternatively receive on the plate the at least another subset of the number of charging boxes, and wherein the another portion of the plurality of additional holes that are formed in the another side include both the at least subset of the plurality of additional holes structured to receive on the another side the at least subset of the number of charging boxes as well as the at least another subset of the plurality of additional holes structured to alternatively receive on the another side the at least another subset of the number of charging boxes.

7. The pedestal of claim 1 wherein the plate comprises a plurality of threaded fasteners and a plurality of receptacles, the plurality of receptacles being receivable at least one of overlying and inside at least some of at least one of the plurality of first holes, the plurality of second holes, and the plurality of additional holes and being threadably cooperable with the plurality of threaded fasteners.

8. The pedestal of claim 7 wherein at least some of the plurality of receptacles each comprise a flange, the flanges overlying the head adjacent the at least some of the at least one of the plurality of first holes, the plurality of second holes, and the plurality of additional holes.

9. The pedestal of claim 8 wherein at least some of the plurality of receptacles each further comprise a clip, the flange being situated on the clip, the clips being mountable to the head and being structured to retain the flanges overlying the head adjacent the at least some of the at least one of the plurality of first holes, the plurality of second holes, and the plurality of additional holes.

10. The pedestal of claim 1 wherein the head further comprises an access cover that is mountable over another opening formed in the case, the another opening being one of:

separate from the opening, and a portion of the opening that remains uncovered by the plate when the plate is mounted to the case.

11. The pedestal of claim 1 wherein the body further comprises a post that is elongated, the head being situated atop the post.

12. The pedestal of claim 1 wherein the body further comprises a base that is structured to be situated on another structure, the post being situated upon the base and extending from the base.

13. A method of mounting onto a pedestal a number of charging boxes, the pedestal having a body having a head, the head having an interior having situated therein a number of electrical service conductors, the head further having a case in which the interior is situated, the case having a side and further having an opening formed in the side, the case further having a plurality of first holes formed therein, the head further having a plate having a plurality of second holes formed therein adjacent a perimeter of the plate, at least a subset of the plurality of second holes being aligned with at least a subset of the plurality of first holes when the plate is received over the opening, the head having a plurality of additional holes formed in at least one of the plate and the case, the method comprising:

mounting at least a subset of the number of charging boxes to at least a subset of the plurality of additional holes;

receiving the plate over the opening;

mounting at least another subset of the number of charging boxes to at least another subset of the plurality of additional holes by at least one of:

removing the at least subset of the number of charging boxes from the at least subset of the plurality of additional holes and alternatively receiving the at least another subset of the number of charging boxes on at least a portion of the at least subset of the plurality of additional holes, and additionally receiving the at least another subset of the number of charging boxes on at least another subset of the plurality of additional holes.

14. The method of claim 13 wherein at least a portion of the plurality of additional holes are formed in the plate, and wherein the method further comprises removing the at least subset of the number of charging boxes from the plate and alternatively receiving the at least another subset of the number of charging boxes on the plate.

15. The method of claim 13 wherein the case comprises another side having formed therein at least a portion of the plurality of additional holes, and wherein the method further comprises removing the at least subset of the number of charging boxes from the another side and alternatively receiving the at least another subset of the number of charging boxes on the another side.

16. The method of claim 13 wherein a portion of the plurality of additional holes are formed in the plate, and wherein the case comprises another side having formed therein another portion of the plurality of additional holes, and wherein the method further comprises:

receiving the at least subset of the number of charging boxes on one of the plate and the another side; and additionally receiving the at least another subset of the number of charging boxes on the other of the plate and the another side.

17. The method of claim 13 wherein the plate includes a plurality of threaded fasteners and a plurality of receptacles, and wherein the method further comprises:

receiving at least some of the plurality of receptacles at least one of overlying and inside at least some of at least one of the plurality of first holes, the plurality of second holes, and the plurality of additional holes; and threadably cooperating at least some of the plurality of threaded fasteners with the at least some of the plurality of receptacles.

18. The method of claim 17 wherein at least some of the plurality of receptacles each comprise a flange, and wherein the method further comprises receiving the flanges to be overlying the head adjacent the at least some of the at least one of the plurality of first holes, the plurality of second holes, and the plurality of additional holes.

19. The method of claim 18 wherein at least some of the plurality of receptacles each further comprise a clip, the flange being situated on the clip, and wherein the method further comprises:

for at least a subset of the at least some of the plurality of receptacles, mounting the clips to the head;

retaining with the clips the flanges in positions overlying the head adjacent the at least some of the at least one of the plurality of first holes, the plurality of second holes, and the plurality of additional holes.

20. The method of claim 13 wherein the head further comprises an access cover, and wherein the case has another opening formed therein, the another opening being one of separate from the opening and a portion of the opening that remains uncovered by the plate when the plate is mounted to the case, and wherein the method further comprises mounting the access cover over the another opening.

* * * * *